(12) United States Patent
Roy et al.

(10) Patent No.: US 9,401,217 B2
(45) Date of Patent: Jul. 26, 2016

(54) FLASH MEMORY WITH IMPROVED READ PERFORMANCE

(71) Applicants: Anirban Roy, Austin, TX (US); Jon S. Choy, Austin, TX (US)

(72) Inventors: Anirban Roy, Austin, TX (US); Jon S. Choy, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 22 days.

(21) Appl. No.: 14/470,359

(22) Filed: Aug. 27, 2014

(65) Prior Publication Data

US 2016/0064092 A1    Mar. 3, 2016

(51) Int. Cl.
| | |
|---|---|
| *G11C 16/26* | (2006.01) |
| *G11C 29/02* | (2006.01) |
| *G11C 16/30* | (2006.01) |
| *G11C 16/34* | (2006.01) |

(52) U.S. Cl.
CPC ............... *G11C 16/26* (2013.01); *G11C 16/30* (2013.01); *G11C 16/349* (2013.01); *G11C 29/021* (2013.01); *G11C 29/028* (2013.01); *G11C 16/3445* (2013.01); *G11C 16/3459* (2013.01); *G11C 2216/04* (2013.01)

(58) Field of Classification Search
CPC ........... G11C 16/3445; G11C 16/3459; G11C 16/26; G11C 16/349; G11C 29/021; G11C 29/028; G11C 2216/04
USPC ................................................... 365/185.22
See application file for complete search history.

(56) References Cited

U.S. PATENT DOCUMENTS

| | | | |
|---|---|---|---|
| 7,649,782 B2 | 1/2010 | Eguchi et al. | |
| 7,986,560 B2 * | 7/2011 | Park | G11C 16/344 365/185.22 |
| 8,116,137 B2 | 2/2012 | Goda et al. | |
| 8,144,517 B2 | 3/2012 | Kim et al. | |
| 8,310,877 B2 | 11/2012 | Cunningham et al. | |
| 8,456,911 B2 | 6/2013 | Yuan et al. | |
| 2008/0117685 A1 * | 5/2008 | Syzdek | G11C 16/28 365/185.21 |
| 2009/0003058 A1 * | 1/2009 | Kang | G11C 11/5642 365/185.03 |
| 2010/0002523 A1 * | 1/2010 | Park | G11C 16/3454 365/185.22 |
| 2010/0118608 A1 * | 5/2010 | Song | G11C 11/5642 365/185.11 |
| 2012/0239991 A1 | 9/2012 | Melik-Martirosian | |
| 2012/0314499 A1 * | 12/2012 | Yuan | G11C 16/349 365/185.11 |
| 2013/0176784 A1 | 7/2013 | Cometti et al. | |

OTHER PUBLICATIONS

Chang, K.M., "SG-TFS: a Versatile Embedded Flash with Silicon Nanocrystals as the Storange Medium", IEEE, Feb. 2008, pp. 1-4.

* cited by examiner

*Primary Examiner* — Richard Elms
*Assistant Examiner* — Xiaochun L Chen

(57) ABSTRACT

A non-volatile memory device includes an array of memory cells and a plurality of word lines and voltage supply lines. Each memory cell of the array is coupled to one of the word lines. Each of the plurality of voltage supply lines is coupled to a first voltage supply terminal of a subset of memory cells of a plurality of subsets of memory cells of the array. Each subset includes a plurality of memory cells. A voltage switch supplies a respective one of a plurality of aged voltages to each of the plurality of subsets of memory cells in the memory array on respective ones of the voltage supply lines. The aged voltage supplied to a first of the plurality of subsets of memory cells is different than the aged voltage supplied to a second of the plurality of subsets of memory cells.

19 Claims, 7 Drawing Sheets

FLASH MEMORY WITH IMPROVED READ PERFORMANCE

BACKGROUND

1. Field

This disclosure relates generally to semiconductor devices, and more specifically, to performing read operations on memory cells in non-volatile memory.

2. Related Art

Semiconductor non-volatile memories (NVMs), and particularly flash electrically erasable, programmable read-only memories (EEPROMs), are widely used in a range of electronic equipment from computers, to telecommunications hardware, to consumer appliances. The flash EEPROM is encountered in numerous configurations. In particular, a floating gate NVM cell is characterized by a stacked gate construction in which a floating gate, typically formed from polysilicon, is separated from the substrate by a first (lower) oxide layer and is separated from a polysilicon control gate by a second (upper) oxide layer. No direct electrical connection is made to the floating gate (hence, "floating"). In another configuration, a charge storage layer comprising nanocrystals as the charge storage mechanism is used in place of the floating gate. The nanocrystals function as isolated charge storage elements.

An NVM typically has millions of memory transistors that are in a programmed or erased state. A transistor is programmed or erased by adjusting the threshold voltage of the transistor through some form of movement of charges into the gate oxide so that if the gate and source of the transistor are biased to a pre-determined voltage and a pre-determined current is impressed on the drain of the transistor, the drain current of the transistor will be a measure of the programmed or erased state of the transistor as indicated in FIG. 1.

The difference between the program and erase voltages for the transistors in the array will be dependent on process variations. In general if all transistors are erased and the gate voltages are measured at a set drain current, then the result roughly will be a Gaussian distribution as shown in FIG. 2. For some NVM's the mean of the distribution will be a low voltage and the highest voltage in the distribution is called the "least erased level" (LEL). For those NVM's the mean of the distribution of programmed transistors will be a higher voltage and the lowest voltage in the distribution is called the "least programmed level" (LPL) as shown in FIG. 3. After a transistor is programmed (or erased), the gate voltage is checked to insure the gate voltage is greater than the LPL (or less than the LEL). Verification voltages, called the "Erase Verify" (EV) and "Program Verify" (PV) voltages are selected to ensure that a transistor is successfully erased or programmed respectively. The EV is slightly greater than the LEL and the PV is slightly less than the LPL, as shown in FIG. 4.

During normal operation, to determine if the transistor is programmed or erased, the gate voltage is driven to a pre-determined READ voltage and its drain current is compared against a reference current by a sense amplifier. The READ voltage is generally a value greater than the LEL voltage and less than the LPL voltage. The selection of the READ voltage can be difficult because the difference between the LEL and the LPL may not be large and cannot be determined a priori. In addition, the LEL and LPL will shift during the life of the NVM. Finally, other design constraints such as sense amplifier resolution will constrict the usable window between the LEL and LPL. Selection of the READ, PV, and EV voltages requires a great deal of effort. Typically a large number of NVM arrays from a large number of wafers are operated and tested for a considerable time in an effort to predict the lifetime performance of the NVM. FIG. 5 shows the variation in the erase and program distributions that are caused by processing variation, aging and cycling. This is an expensive undertaking and greatly extends the development time of NVM technology.

As devices continue to become smaller with advances in semiconductor device technology, the performance of the individual memory cells has become more important. The read function and threshold voltage variation in particular suffer with reduced device size. Accordingly, it is desirable to improve upon the issues raised above concerning reading an NVM memory.

BRIEF DESCRIPTION OF THE DRAWINGS

The present invention is illustrated by way of example, and not by way of limitation, in the figures of the accompanying drawings and in which like reference numerals refer to like elements and in which.

DETAILED DESCRIPTION

Generally, embodiments of the present invention provide non-volatile memory devices with increased endurance and improved read margin that is achieved by dynamically optimizing the gate voltage used during read operations based on the number of bits cells that do not pass erase verify operation. To maintain read performance as the memory cells age, the gate voltage can be adjusted per erase sector. Several levels of adjustment can be available for the gate voltage for each erase sector to achieve optimum performance over several stages of aging.

Figure 1:
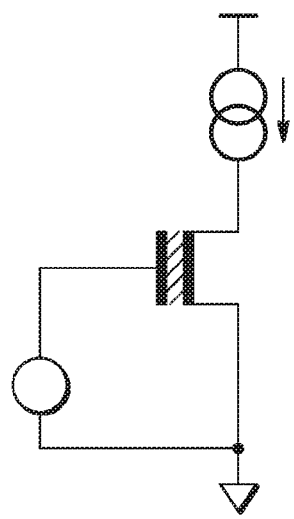
FIG. 1 is a circuit diagram of an NVM bit cell that is used to form an array of NVM bit cells in which the NVM bit cell is biased in its read condition according to the prior art.
Figure 2:
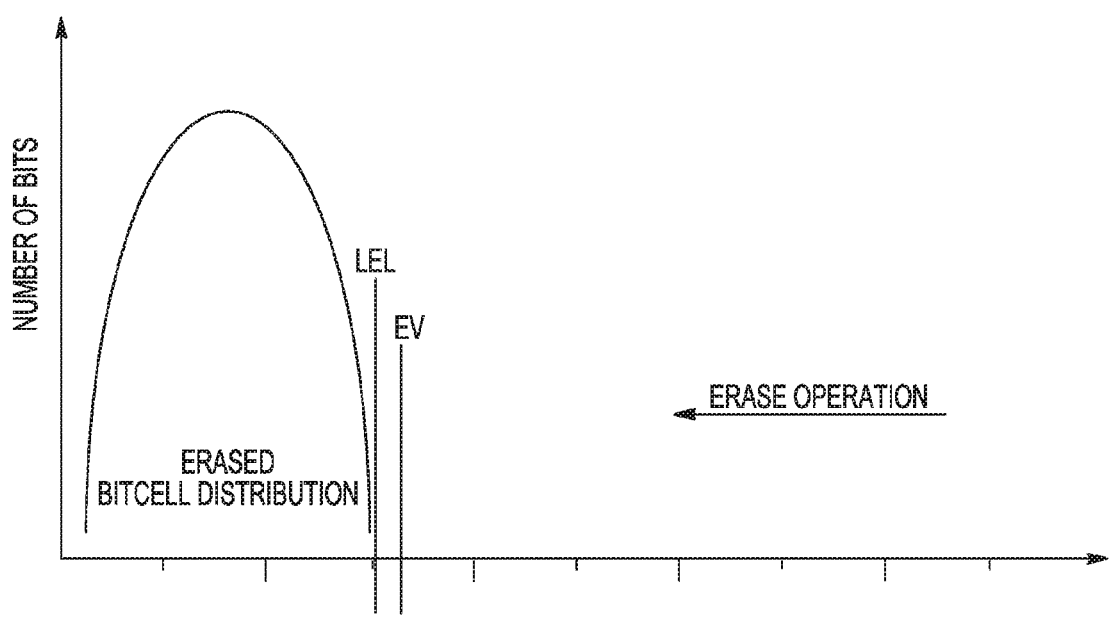
FIG. 2 is an erased distribution of an array of NVM bit cells using the NVM bit cell of FIG. 1.
Figure 3:
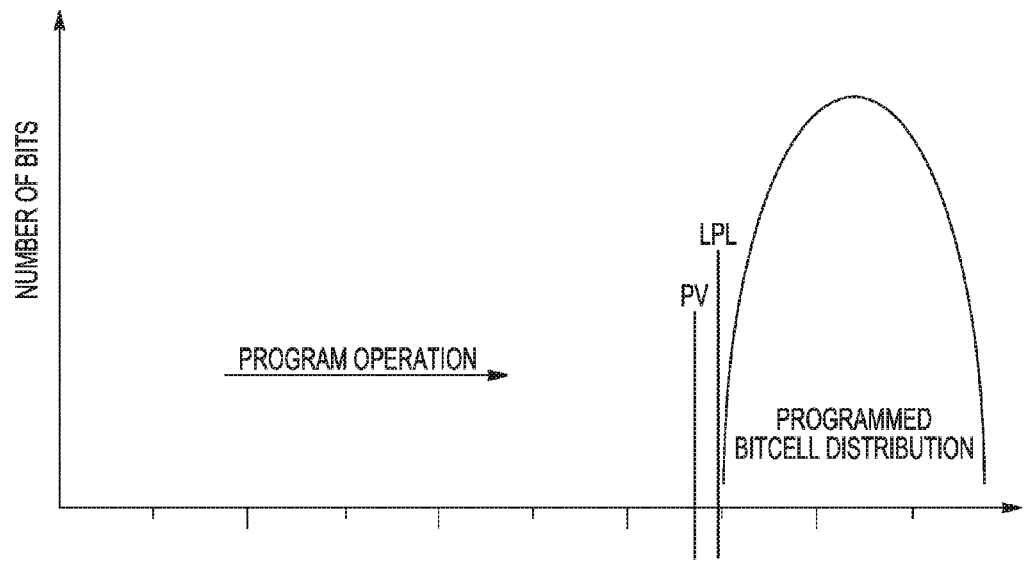
FIG. 3 is a programmed distribution of an array of NVM bit cells using the NVM bit cell of FIG. 1.
Figure 4:
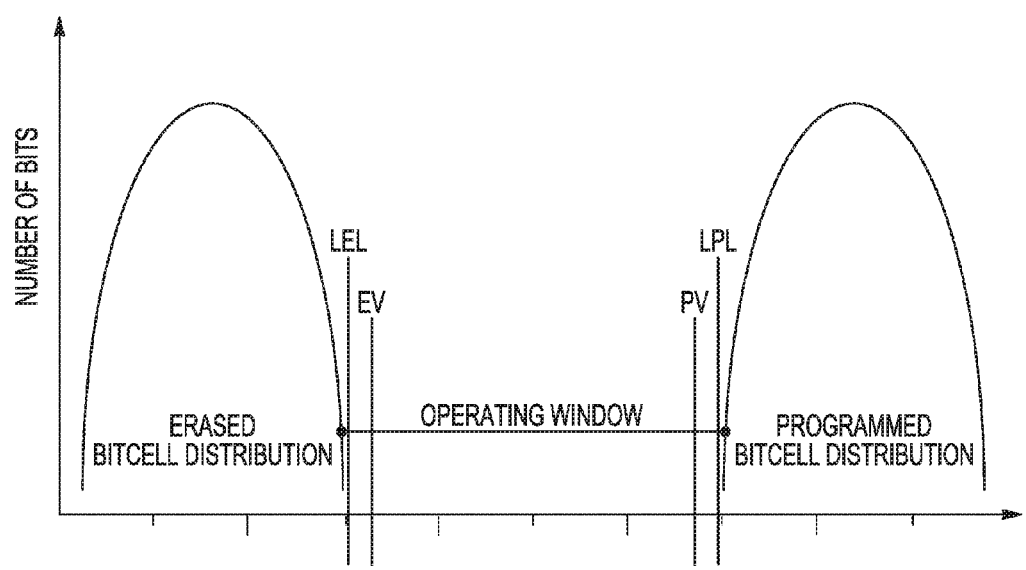
FIG. 4 is a combination of the distributions of FIGS. 2 and 3 to show an operating window.
Figure 5:
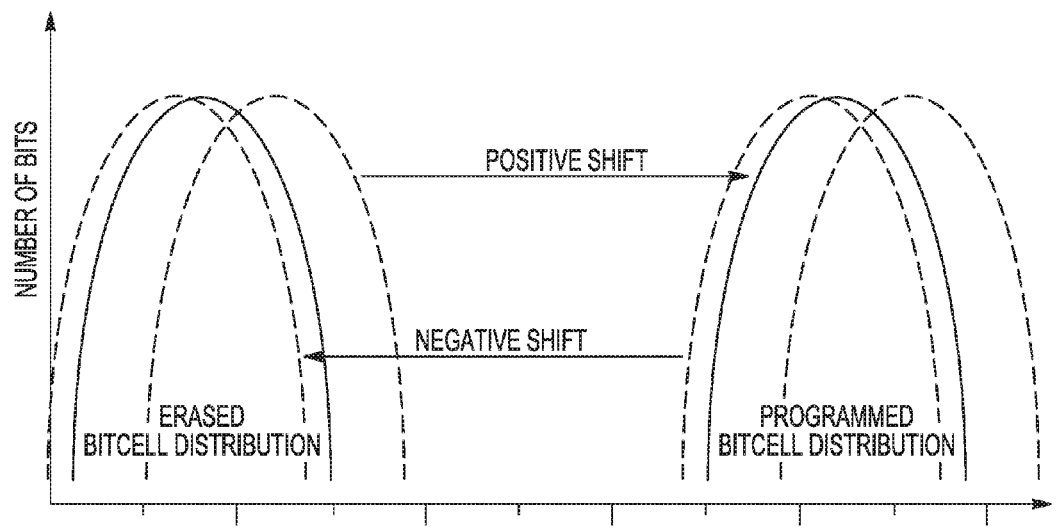
FIG. 5 is shows the distributions of FIG. 4 with performance variations.
Figure 6:
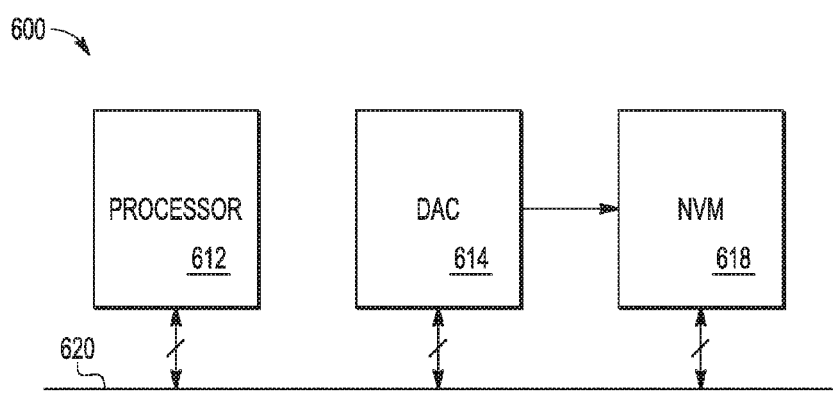
FIG. 6 is a block diagram of an embodiment of a processing system in which an array of the NVM bit cell of FIG. 1 can be used.

Shown in FIG. 6 is a computer processing system 600 including a processor 612 coupled to a bus 620 and a non-volatile memory (NVM) device 618 coupled to bus 620. DAC 614 is also directly coupled to NVM device 618. DAC 614 provides an analog signal selected by processor 612 for use as a voltage during read, erase verify and program verify modes. DAC 614 may be also connected to other elements of system 600 not shown in FIG. 6.

Processor 612 can be a system-on-a-chip or other suitable data processor with any number of processing cores, cache memory units, memory management units, random access memory, signal processing components, and other suitable components.

NVM device 618 can include an analog generation unit or charge pump system that provides one or more levels of voltage to read, program and erase memory cells in a memory array. The memory array can be any suitable type of non-volatile memory such as flash memory. In some embodiments, the memory array includes split gate memory cells with nanocrystal storage elements, such as the Thin Film Storage (TFS) memory array commercially available from Freescale Semiconductor, Inc. of Austin, Tex.

An analog generation unit in NVM device 618 can include calibration and trim data registers, medium voltage pump and high voltage pump. Calibration and trim data registers can store charge pump configuration information. The output of a first voltage pump can be provided to the select gate of the memory cells in the memory array and the output of a second voltage pump can be provided to the control gate of the memory cells in the memory array.

Figure 7:
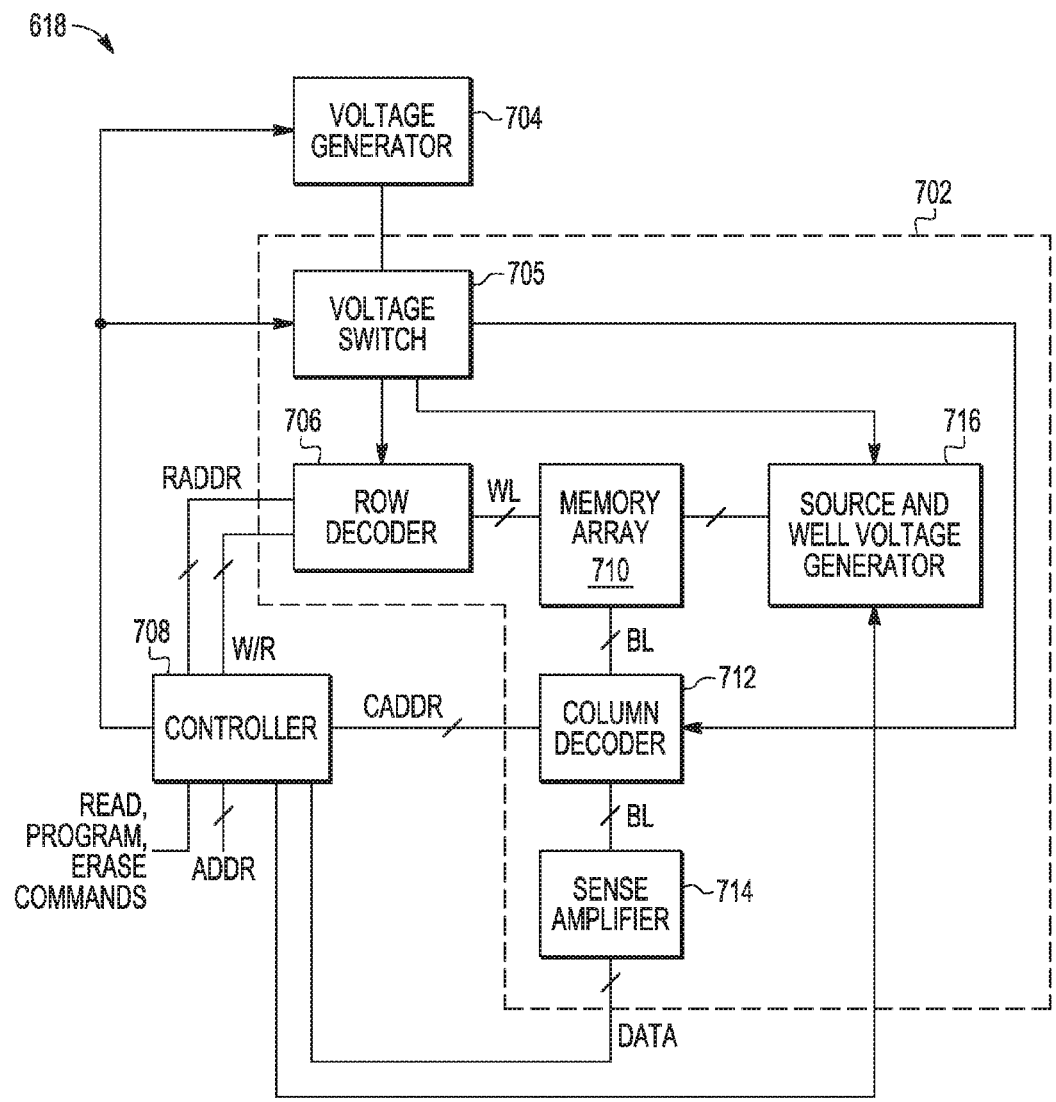
FIG. 7 illustrates, in block diagram form, an embodiment of an NVM device that can be used in the system of FIG. 6.

FIG. 7 illustrates, in block diagram form, an integrated circuit non-volatile memory device 618 in accordance with an embodiment of the present invention. Generally, memory device 618 includes a memory device 702 coupled to voltage generator 704 and controller 708. Memory device 702 includes voltage switch 705, row decoder 706, an array of memory cells 710, column decoder 712, sense amplifier 714, and source and well voltage generator 716. Memory cell array 710 is typically a two-dimensional array of memory cells that can be specified individually by row and column address, or in groups by block, sector, page or other suitable segment. Controller 708 is coupled to receive commands such as read, program and erase, and one or more memory addresses (ADDR) from an external component such as processor 612 in FIG. 6.

Sense amplifier 714 supplies data from specified cells in memory array 710 to controller 708. Controller 708 is further coupled to provide voltage command signals to voltage generator 704, row addresses (RADDR) to row decoder 706 and column addresses (CADDR) to column decoder 712 based on the incoming address (ADDR). Voltage commands from controller 708 can be based on voltage levels required to program, read, or erase memory cells specified by the row address(es) (RADDR) and column address(es) (CADDR).

Voltage generator 704 provides nominal voltages (also referred to herein as default trim voltages) to be supplied to word lines (WL) and bit lines (BL) of memory cells in memory array 710 based on operations to be performed. The nominal voltages are supplied to voltage switch 705, which includes logic to determine whether to adjust the nominal voltages to take into account aging of the memory cells. For example, if 1 Volt is specified to perform a read operation when the memory cells are first put into service, a higher voltage, such as 1.2 Volts, may be required to achieve the same performance after the gates of the memory cells have incurred some trap up. Voltage switch 705 can provide adjustments to the nominal voltages for multiple sectors or other segments of memory array 710, and can also provide two or more different adjustment values per sector so the adjustment can gradually increase as performance of the memory cells decreases.

Column decoder 712 can include, for example, bit line equalization and precharge circuits, and buffer circuits. Column decoder 712 has an input terminal for receiving a plurality of column address (CADDR), a first plurality of terminals coupled to true and complementary bit line pairs BL, and a plurality of input/output (I/O) terminals for receiving or providing data signals labeled "DATA". As illustrated in FIG. 7, bit lines run in the column direction.

The voltage on the word line is varied during erase verify and program verify to identify where memory cells can be read as programmed or erased after programming and erasing respectively using a different level for the voltage applied to the word line. The voltage on the word line during a read is considered the read voltage and is pulled up to just over the threshold voltage of an erased memory cell. The bit line will be pulled low fast if the selected memory cell has been erased. Otherwise for a programmed memory cell the bit line will discharge slowly based on the leakage currents of the unselected memory cells. The read voltage is the voltage that is to be optimized, such as by method 1000 shown in FIG. 10 for read, erase verify, and program verify operations.

Figure 8:
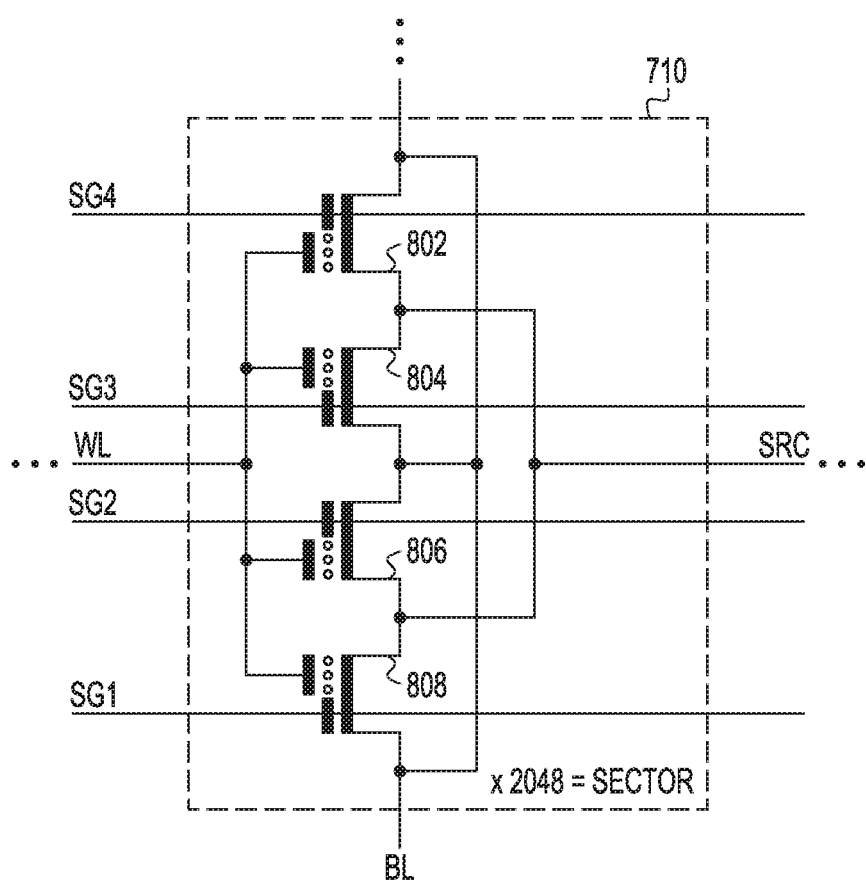
FIG. 8 is a circuit diagram of a portion of the NVM device of FIG. 7

Shown in FIG. 8 is a portion of NVM array 710 including NVM memory cells 802, 804, 806, and 808 which are split NVM memory cells in that they each have a control gate and a select gate. Memory cell 802 has a select gate coupled to a select gate line SG4, a control gate coupled to a word line WL, a first current electrode coupled to a source SRC, and a second current electrode coupled to a bit line. Memory cell 804 has a select gate coupled to a select gate line SG3, a control gate coupled to the word line WL, a first current electrode coupled to the source SRC, and a second current electrode coupled to bit line BL. Memory cell 806 has a select gate coupled to a select gate line SG2, a control gate coupled to the word line WL, a first current electrode coupled to the source SRC, and a second current electrode coupled to bit line BL. Memory cell 808 has a select gate coupled to a select gate line SG1, a control gate coupled to the word line WL, a first current electrode coupled to the source SRC, and a second current electrode coupled to the bit line BL. Charge storage, which may be nanocrystals, is shown under the select gates.

The portion of memory array 710 shown includes a column of four memory cells that is repeated along the row direction and column direction. In the row direction, the select gate lines extend to the units in that direction as does the word line and source line. Each unit in the row direction is connected to different bit lines. In the column direction, the units are connected to bit line BL but to a different source line. During a read, a voltage is applied to both the select gate and control gate of a selected memory cell. Within a unit, the select gate lines SG1, SG2, SG3, and SG4 distinguish as to which cell is selected for reading. For programming, selected cells as selected by select gate lines SG1, SG2, SG3, and SG4 are programmed. The voltage on the word line is varied during erase verify and program verify to identify where memory cells can be read as programmed, or erased after programming and erasing, respectively using a different level for the voltage applied to the word line. The voltage on the word line during a read is considered the read voltage. This is the voltage that is to be optimized by a method shown in FIG. 10 for a normal read.

Figure 9:
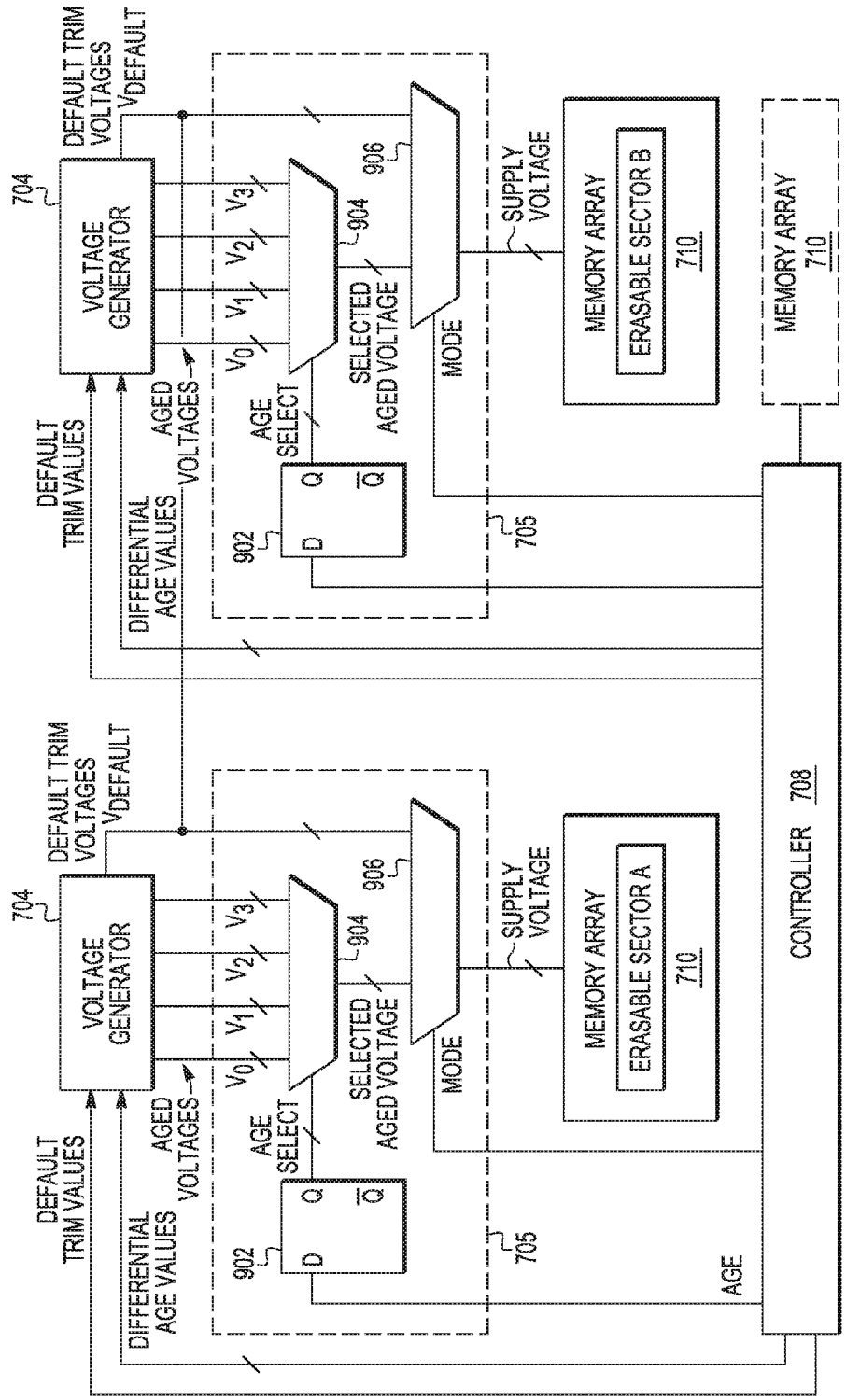
FIG. 9 illustrates, in schematic diagram form, additional detail of some of the components that can be included in the NVM device of FIG. 7.

FIG. 9 illustrates, in schematic diagram form, additional detail of some of the components that can be included in the NVM device 618 of FIG. 7 including two subsets (referred to as "sectors") of memory cells of memory array 710. Each subset of memory cells of memory array 710 is coupled to receive supply voltage from voltage switch 705. Each voltage switch 705 includes a latch unit 902 with an output coupled to a control input of a multiplexer 904. Controller 708 provides input such as age information to latch units 902 to cause latch units 902 to provide an age select signal to control multiplexers 904. The age select signal indicates which of several aged voltages (shown as $V_0, V_1, V_2, V_3$) to use to read the memory cells during read, erase verify, and program verify operations for each subset of memory cells in memory array 710. The aged voltage for each subset of memory cells is determined and selected independently of the aged voltage for the other subsets of memory cells. The aged voltage is the sum of a default trim voltage (e.g. $V_{DEFAULT}$) plus a differential age voltage (e.g. $\Delta V_0, \Delta V_1, \Delta V_2, \Delta V_3$). The differential age voltage corresponds to a respective differential age value provided to voltage generator 704 from controller 708. The aged voltages can be derived by voltage generator 704 based on the differential age values using one or more table lookups, formulas, or other suitable techniques. In other implementations, controller 708 can specify the aged voltages to be used directly to voltage generator 704. When the "age" of each subset of memory cells in memory array 710 increases, the age selection signal is incremented to select the next differential age voltage. The differential age voltages can have successively higher values to overcome the increase in threshold voltage of the memory cells that can occur over time as charge trap up and/or other aging effect(s) increase. The ability to adjust the voltage several times over the life of memory array 710 and during different modes of operation improves the reliability and performance of memory array 710 despite aging effects that can occur over time.

Some subsets of memory cells in memory array 710 may age faster than others, so different subsets of memory cells of memory array 710 can use independently selected differential age voltages based on the number of memory cells in the subset that do not pass a read, erase verify, and/or program verify operation for a particular subset. Each of the subsets of memory cells may have a different number of cells that do not pass the read, erase verify, and/or program verify operation, and can therefore have different ages. The higher the number of cells that do not pass the read, erase verify, and/or program verify operation, the higher the value of the differential age voltage that can be used to adjust a default trim voltage that is used to read the memory cells during the read, erase verify, and/or program verify operation.

The selected aged voltage for each subset of cells is provided to a multiplexer 906 along with the default trim voltage. Controller 708 provides a control input to multiplexer 906 indicating whether memory device 618 is operating in aged mode. When operating in aged mode, the selected aged voltage is used to read memory cells in a corresponding subset of memory cells in memory array 710. When not operating in aged mode, the default trim voltage is used. One or more sets of default trim values and/or voltages can be stored in a memory array 710 where other trim data is stored or other suitable data storage location. Age information for each of the subsets of memory cells may also be stored in memory array 710 or other suitable location. Controller 708 can supply default trim values to voltage generator 704 to provide voltage corresponding to the default trim voltage to multiplexer 906. Controller 708 can further supply a differential age value or signal to voltage generator 704. Voltage generator 704 provides aged voltages corresponding to the differential age values to multiplexer 904. Even though four aged voltages are shown as input to multiplexer 904, any suitable number of aged voltages can be used.

Figure 10:
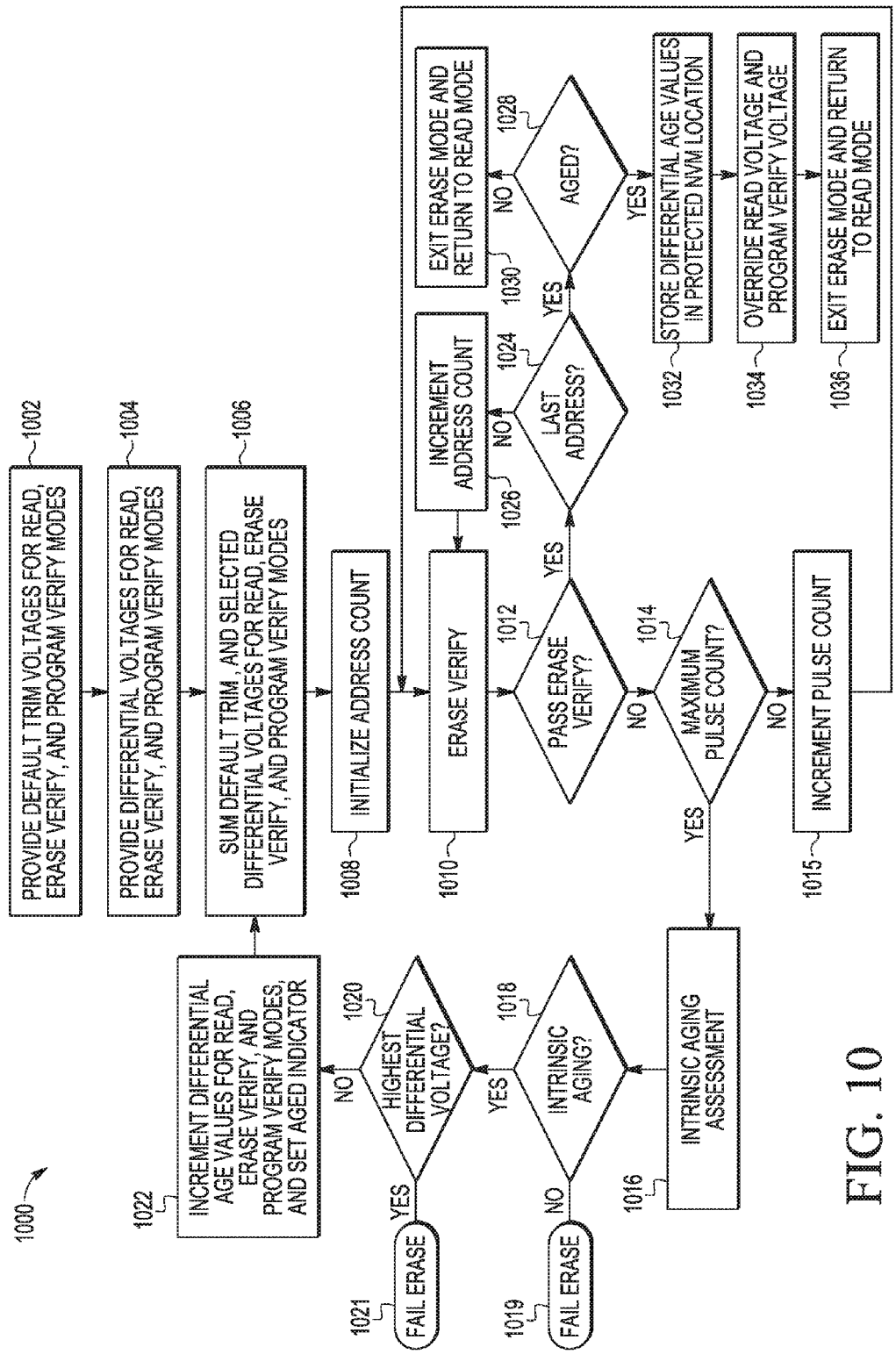
FIG. 10 illustrates a flow diagram of an embodiment of a method for operating the NVM device of FIG. 7.

Referring to FIGS. 9 and 10, FIG. 10 illustrates a flow diagram of an embodiment of a method 1000 for operating the NVM device 618 of FIG. 7 for one of multiple subsets of memory cells in memory array 710. Process 1002 includes loading default trim values for read, erase verify and program verify modes of operation. The default trim values may be stored in and loaded from memory array 710 or other suitable data storage location in processing system 600. Once the default trim values are provided to controller 708, controller 708 provides the default trim values to voltage generator 704, which supplies voltages corresponding to the default trim values to multiplexer 906.

Process 1004 includes providing one or more differential age values for the read, erase verify, and program verify modes from memory array 710 or other suitable data storage location in processing system 600 to controller 708. Controller 708 provides the differential age values to voltage generator 704, which supplies aged voltages corresponding to the differential age values to multiplexer 904. An aged voltage for each mode (read, erase verify and program verify) can be selected by multiplexer 904 based on an age assessment of the subset of memory cells.

Process 1006 includes summing the default trim voltages and the differential age voltages when the memory device 618 is in aged mode to generate—aged voltages for each of the read, erase verify and program verify modes. The aged voltages are used to read a subset of memory cells during corresponding read, erase verify, and program verify modes of operation.

Process 1008 includes initializing an address count, for example, the address count can be initialized to a number of memory cells in the subset of memory cells to be erased. Subsets of the memory cells will typically include the same number of memory cells. The address count is incremented as erasure of the memory cells is verified by reading the memory cells during the erase verify operation.

Process 1010 includes performing the erase verify operation during which each memory cell is read after an erase operation has been performed. If a memory cell has not been erased, the memory cell will retain a threshold voltage that is higher than a desired erased threshold voltage.

Process 1012 includes determining whether any of the memory cells retain a higher than desired erased threshold voltage. If even one memory cell has not been erased, i.e., at least one memory cell retains a threshold voltage that is higher than a desired erased threshold voltage, the erase verify procedure does not pass and process 1012 transitions to process 1014.

Process 1014 includes determining whether a maximum pulse count for the erase verify operation has been used. If not, process 1014 transitions to process 1015 to increment the pulse count used during the erase verify operation. Process 1015 then transitions to process 1010 to repeat the erase verify operation using the incremented pulse count.

Returning to process 1014, if the maximum pulse count has been used for the erase verify operation, process 1016 performs an aging assessment on the subset of memory cells being erased. In some embodiments, the age assessment of the subset of memory cells includes determining a number of memory cells that have a threshold voltage above a specified percent or amount. For example, the age assessment can be performed by subtracting the differential age voltage from the adjusted erase verify voltage being used during the erase verify operation and reading some or all of the memory cells. The percentage of memory cells read with a threshold voltage above a specified threshold voltage can indicate the "age" of the subset of memory cells. Several different age levels can be used for each subset of memory cells and successively higher voltages can be used to read the memory cells as the memory cells progress through different age levels, for example as the percentage of memory cells with threshold voltages higher than the specified voltage increases.

Once the age of the memory cells has been assessed, process 1018 determines whether the assessment of the age of the memory cells indicates the subset of memory cells has aged. If the subset of memory cells has not aged, a fail erase indicator is set in process 1019. If the subset of memory cells has aged, process 1020 determines whether the last or highest differential age voltages have been used. If so, a fail erase indicator is set in process 1021. If not, process 1022 increments the differential age values for erase verify, read and program verify modes, sets an aged indicator, and transitions back to process 1006 to add incremented differential age voltages to corresponding default trim voltages and repeat the erase verify operation. The incrementally higher read voltages are more likely to cause all of the memory cells to pass the erase verify operation without over-erasing the memory cells. Additionally, the aged voltages used for read and program verify are also more likely to cause all of the memory cells to pass the corresponding read and/or program verify operations without subjecting the memory cells to more voltage than necessary to successfully complete the operation.

Returning again to process 1012, if the memory cells specified by the address count have passed erased verify, process 1024 determines whether the last address of the memory cells have been through the erase verify operation. If not, process 1026 increments the address count and transitions to process 1010 to perform the erase verify operation on the next group of memory cells in the subset. If the last address of the memory cells have been through the erase verify operation, process 1028 determines whether the aged indicator has been set. If not, process 1030 exits the erase mode and returns to read mode. If the aged indicator has been set, process 1032 stores the differential age values corresponding the last differential age voltages used in a reserved location in memory array 710 or other suitable location. The stored differential age values will be the starting values the next time the read, erase verify, and/or program verify operations are performed on the subset of memory cells.

Process 1034 restores the sector to read mode from erase mode. If the sector has been aged then the sector can use an elevated read voltage based on the age of the sector. The erase verify, program verify, and read voltages for the sector can shift approximately the same amount or other suitable amount. Other sectors can have different erase verify, program verify, and read voltages, depending on their "age".

Process 1036 exits the erase mode and returns to the read mode.

Note that although the differential age values for read, erase verify, and program verify are determined during the erase verify mode in FIG. 10, in other embodiments, the differential age values for the three modes may alternatively be determined in the read and/or program verify mode in addition to or instead of the erase verify mode. In such embodiments, criteria for determining whether the read or program verify operation has completed successfully can be used instead of criteria used for the erase verify operation. For example, process 1010 could perform the program verify operation, process 1014 could determine whether the program verify operation passed, process 1014 could determine whether a maximum pulse count for the program verify operation has been reached, and process 1015 could increment the pulse count for the program verify operation.

By now it should be appreciated that in some embodiments, a non-volatile memory device can comprise an array of memory cells. Each memory cell of the array can include a first supply voltage terminal and a second supply voltage terminal. Each memory cell of the array is coupled to a word line. Each of a plurality of voltage supply lines can be coupled to a first voltage supply terminal of a subset of memory cells of a plurality of subsets of memory cells of the array. Each subset of the plurality of subsets includes a plurality of memory cells. A voltage switch can supply a respective one or more of a plurality of aged voltages to each of the plurality of subsets of memory cells in the memory array on respective ones of the plurality of voltage supply lines during at least one of read, program verify, and erase verify operations. The respective one of the aged voltages supplied to a first of the plurality of subsets of memory cells is different than the respective one of the aged voltages supplied to a second of the plurality of subsets of memory cells.

In another aspect, the voltage switch can be configured to generate each of the plurality of aged voltages based on trim voltages and one of a plurality of differential age values.

In another aspect, the voltage switch supplies the respective one or more of the aged voltages during the at least one of the read, erase verify, and program verify operations, and the voltage switch supplies default trim voltages during other modes.

In another aspect, the memory device can further comprise a plurality of differential age values that correspond to numbers of the memory cells that do not pass erase verify. Each of the plurality of differential age values can correspond to a different number of the memory cells that do not pass erase verify.

In another aspect, one of the plurality of differential age values can be used to determine the aged voltages for a corresponding one of the plurality of subsets of memory cells independently of the differential age values used to determine the aged voltages other of the plurality of subsets of memory cells.

In another aspect, when the number of the memory cells in the one of the subsets of memory cells that do not pass the at least one of read, program verify, and erase verify operations changes, a different one of the plurality of differential age values can be selected for one of the plurality of subsets of memory cells. The differential age values can be selected for each of the plurality of subsets of memory cells independently of other of the plurality of subsets of memory cells.

In another aspect, the memory device can further comprise a controller operable to access default trim voltages and the plurality of differential age values for each of the plurality of subsets of memory cells. One of the differential age values can be used to determine differential age voltages to be added to the default trim voltage to generate the aged voltages. The default trim voltage and the differential age voltages for each of the plurality of subsets of memory cells can be determined independently of the other subsets of memory cells.

In another aspect, the memory device can further comprise a controller coupled to the voltage switch. The controller can be operable to increment the differential age value for each of the subsets of memory cells when a specified number of memory cells in each of the subsets of memory cells have threshold voltages above a predetermined amount.

In another aspect, the controller is coupled to supply a signal to the voltage switch to select one of the plurality of differential age values.

In yet another embodiment, a method for operating a memory can comprise, for each of a plurality of subsets of memory cells in a non-volatile memory array, summing a default trim voltage with a differential age voltage to generate an aged voltage. When a memory operation fails using the aged voltage, an age of a respective one of the plurality of subsets of memory cells is assessed. When the age of the respective one of the plurality of subsets of memory cells is above one of a plurality of age thresholds, the differential age voltage is incremented, the default trim voltage is summed with the incremented differential age voltage to generate another aged voltage. The other aged voltage is used to perform the memory operation.

In another aspect, the assessing the age of the respective one of the plurality of subsets of memory cells includes determining a number of memory cells that do not pass the memory operation.

In another aspect, the assessing the age of the respective one of the plurality of subsets of memory cells is performed when the memory operation fails and an erase verify maximum pulse count has been reached.

In another aspect, the method can further comprise setting an aged indicator when the differential age value is incremented.

In another aspect, the method can further comprise, when the aged indicator is set and the memory operation is successful, storing a most recent differential age value, and using the most recent differential age value to update the aged voltage during a next same memory operation.

In another aspect, the method can further comprise, when the memory operation fails using the most recent aged voltage, indicating failure of the memory operation when a last differential age value has been used to update the aged voltage.

In another embodiment, a non-volatile memory device can comprise an array of memory cells, and a controller coupled to a voltage generator and a voltage switch. The voltage switch can be coupled to the voltage generator, a row decoder and a column decoder to provide different voltage levels for read and erase operations to the row and column decoders. The controller can include logic instructions operable to, for each of a plurality of subsets of memory cells in a non-volatile memory array, sum a default trim voltage with a differential age voltage to generate an aged voltage. When a memory operation fails using the aged voltage, the controller can assess an age of a respective one of the plurality of subsets of memory cells, wherein the age of the respective one of the plurality of subsets of memory cells is assessed by determining a number of memory cells that do not pass the memory operation.

In another aspect, the controller can be further operable to, when the age of the respective one of the plurality of subsets of memory cells is above one of a plurality of age thresholds, increment the differential age voltage, sum the default trim voltage with the incremented differential age voltage to generate an updated aged voltage, and use the updated aged voltage to perform a subsequent memory operation.

In another aspect, the age of the respective one of the plurality of subsets of memory cells can be assessed when the memory operation fails and a maximum pulse count has been reached.

In another aspect, the controller can be further operable to set an aged indicator when the differential age voltage is incremented.

In another aspect, the controller can be further operable to when the aged indicator is set and the memory operation is successful, store a most recent differential age value, and use the most recent differential age value to update the aged voltage during a next memory operation.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A non-volatile memory device comprising:
an array of memory cells, wherein each memory cell of the array includes a first supply voltage terminal and a second supply voltage terminal;
a plurality of word lines, wherein each memory cell of the array is coupled to a word line of the plurality of word lines;
a plurality of voltage supply lines, each voltage supply line of the plurality of voltage supply lines is coupled to a first voltage supply terminal of a subset of memory cells of a plurality of subsets of memory cells of the array, wherein each subset of the plurality of subsets includes a plurality of memory cells;
a voltage switch operable to supply a respective one or more of a plurality of aged voltages to each of the plurality of subsets of memory cells in the memory array on respective ones of the plurality of voltage supply lines during at least one of program verify and erase verify operations, wherein the respective one of the aged voltages supplied to a first of the plurality of subsets of memory cells is different than the respective one of the aged voltages supplied to a second of the plurality of subsets of memory cells; and
a plurality of differential age values that correspond to numbers of the memory cells that do not pass erase verify, wherein each of the plurality of differential age values corresponds to a different number of the memory cells that do not pass erase verify.

2. The memory device of claim 1 further comprising the voltage switch is configured to generate each of the plurality of aged voltages based on trim voltages and one of a plurality of differential age voltages.

3. The memory device of claim 1 wherein the voltage switch supplies the respective one or more of the aged voltages during the at least one of the erase verify and program verify operations, and the voltage switch supplies default trim voltages during other modes.

4. The memory device of claim 1, wherein one of the plurality of differential age values is used to determine the aged voltages for a corresponding one of the plurality of subsets of memory cells independently of the differential age values used to determine the aged voltages of other of the plurality of subsets of memory cells.

5. The memory device of claim 1 wherein when the number of the memory cells in the one of the subsets of memory cells that do not pass the at least one of program verify and erase verify operations changes, a different one of the plurality of differential age values is selected for one of the plurality of subsets of memory cells, and the differential age values are selected for each of the plurality of subsets of memory cells independently of other of the plurality of subsets of memory cells.

6. The memory device of claim 1 further comprising a controller operable to access default trim voltages and the plurality of differential age values for each of the plurality of subsets of memory cells, wherein one of the differential age values are used to determine differential age voltages to be added to the default trim voltages to generate the aged voltages, and the default trim voltage and the differential age voltages for each of the plurality of subsets of memory cells are determined independently of the other of the plurality of subsets of memory cells.

7. The memory device of claim 6 further comprising a controller coupled to the voltage switch, the controller is operable to increment the differential age value for each of the subsets of memory cells when a specified number of memory cells in each of the subsets of memory cells have threshold voltages above a predetermined amount.

8. The memory device of claim 1 wherein the controller is coupled to supply a signal to the voltage switch to select one of the plurality of differential age values.

9. A method for operating a memory device comprising:
for each of a plurality of subsets of memory cells in a non-volatile memory array:
summing a default trim voltage with a differential age voltage to generate an aged voltage;
when an erase verify or program verify memory operation fails using the aged voltage:
assessing an age of a respective one of the plurality of subsets of memory cells;
when the age of the respective one of the plurality of subsets of memory cells is above one of a plurality of age thresholds:
incrementing the differential age voltage;
summing the default trim voltage with the incremented differential age voltage to generate another aged voltage; and
using the other aged voltage to perform the erase verify or program verify memory operation.

10. The method of claim 9 wherein the assessing the age of the respective one of the plurality of subsets of memory cells includes determining a number of memory cells that do not pass the erase verify or program verify memory operation.

11. The method of claim 9, wherein the assessing the age of the respective one of the plurality of subsets of memory cells is performed when the erase verify or program verify memory operation fails and an erase verify maximum pulse count has been reached.

12. The method of claim 9 further comprising:
setting an aged indicator when the differential age voltage is incremented.

13. The method of claim 12 further comprising:
when the aged indicator is set and the erase verify or program verify memory operation is successful,
storing a most recent differential age value, and
using the most recent differential age value to update the aged voltage during a next same erase verify or program verify memory operation.

14. The method of claim 13 further comprising:
when the erase verify or program verify memory operation fails using the most recent aged voltage:
indicating failure of the erase verify or program verify memory operation when a last differential age value has been used to update the aged voltage.

15. A non-volatile memory device comprising:
an array of memory cells;
a controller coupled to a voltage generator and a voltage switch;
the voltage switch is coupled to the voltage generator, a row decoder and a column decoder, the voltage switch is operable to provide different voltage levels for read and erase operations to the row and column decoders;
the controller includes logic instructions operable to, for each of a plurality of subsets of memory cells in a non-volatile memory array:
sum a default trim voltage with a differential age voltage to generate an aged voltage;
when an erase verify or program verify memory operation fails using the aged voltage:
assess an age of a respective one of the plurality of subsets of memory cells, wherein the age of the respective one of the plurality of subsets of memory cells is assessed by determining a number of memory cells that do not pass the erase verify or program verify memory operation.

16. The memory device of claim 15, wherein the controller is further operable to:
when the age of the respective one of the plurality of subsets of memory cells is above one of a plurality of age thresholds:
increment the differential age voltage;
sum the default trim voltage with the incremented differential age voltage to generate an updated aged voltage; and
use the updated aged voltage to perform a subsequent erase verify or program verify memory operation.

17. The memory device of claim 15, wherein the age of the respective one of the plurality of subsets of memory cells is assessed when the erase verify or program verify memory operation fails and a maximum pulse count has been reached.

18. The memory device of claim 16 wherein the controller is further operable to:
set an aged indicator when the differential age voltage is incremented.

19. The memory device of claim 18 wherein the controller is further operable to:
when the aged indicator is set and the erase verify or program verify memory operation is successful,
store a most recent differential age value, and use the most recent differential age value to update the aged voltage during a next erase verify or program verify memory operation.

* * * * *